US010161969B2

(12) United States Patent
Ghislanzoni

(10) Patent No.: US 10,161,969 B2
(45) Date of Patent: Dec. 25, 2018

(54) METHOD AND APPARATUS FOR THE MEASUREMENT OF ELECTRICAL CURRENT BY MEANS OF A SELF-COMPENSATING CONFIGURATION OF MAGNETIC FIELD SENSORS

(71) Applicant: C-Sigma S.R.L., Lecco (IT)

(72) Inventor: Luca Ghislanzoni, Lecco (IT)

(73) Assignee: C-Sigma s.r.l., Lecco (IT)

( * ) Notice: Subject to any disclaimer, the term of this patent is extended or adjusted under 35 U.S.C. 154(b) by 0 days.

(21) Appl. No.: 15/432,752

(22) Filed: Feb. 14, 2017

(65) Prior Publication Data

US 2017/0276707 A1  Sep. 28, 2017

(30) Foreign Application Priority Data

Feb. 15, 2016 (EP) ..................... 16020044

(51) Int. Cl.
*G01R 15/18* (2006.01)
*G01R 15/20* (2006.01)
*H01F 27/24* (2006.01)
*H01F 27/28* (2006.01)
*G01R 19/32* (2006.01)

(52) U.S. Cl.
CPC ......... *G01R 15/183* (2013.01); *G01R 15/202* (2013.01); *G01R 15/205* (2013.01); *G01R 19/32* (2013.01); *H01F 27/24* (2013.01); *H01F 27/28* (2013.01)

(58) Field of Classification Search
CPC .... G01R 15/18; G01R 15/181; G01R 15/183; G01R 15/185; G01R 15/186; G01R 15/20; G01R 15/202; H01F 27/28; H01F 27/24

See application file for complete search history.

(56) References Cited

U.S. PATENT DOCUMENTS

| 9,541,580 | B2 * | 1/2017 | Nodera ................ G01R 15/183 |
| 2014/0009146 | A1 * | 1/2014 | Blagojevic ............ G01R 33/04 |
| | | | 324/252 |
| 2015/0331015 | A1 * | 11/2015 | Lee ...................... G01R 15/185 |
| | | | 324/117 R |

* cited by examiner

*Primary Examiner* — Son Le

(57) ABSTRACT

Two magnetic field sensors, ratiometric with respect to their common supply and featuring matched thermal coefficients, are inserted in the two airgaps of a magnetic circuit arranged so that said airgaps appear in series with respect to the magnetic flux generated by the current to be measured, while appearing in parallel with respect to the reference flux generated by a stable permanent magnet. The output signal of one of the sensors is thus proportional to the sum of said fluxes, the other to their difference. Adding and subtracting said signals produces two outputs, one proportional solely to the current to be measured, and the other solely to the reference flux. A feedback loop acts on the common supply of the two sensors in order to hold constant the output proportional to the reference flux, thus producing the effect that drifts with temperature of the magnetic sensitivities are intrinsically compensated for.

4 Claims, 5 Drawing Sheets

METHOD AND APPARATUS FOR THE MEASUREMENT OF ELECTRICAL CURRENT BY MEANS OF A SELF-COMPENSATING CONFIGURATION OF MAGNETIC FIELD SENSORS

FIELD OF THE INVENTION

The present invention relates to a method and an apparatus of the magnetically coupled type for measuring electrical current which may be A.C. and/or D.C. The apparatus includes the improvement of employing a method effective in greatly reducing, thanks to a self-compensating configuration of magnetic field sensors, the negative impact on overall accuracy of drifts with temperature and aging of the electrical characteristics said magnetic field sensors.

BACKGROUND OF THE INVENTION

Magnetic field sensors are used as detector components for measuring electrical currents. Detailed information on such devices can be found in the technical literature, and reference may be made, for example, to Siemens' data book entitled "Galvanomagnetic devices" published 1976/1977, to Honeywell's Application Note "HALL EFFECT SENSING AND APPLICATION", as well as to Allegro's Application Note STP98-1-AN.

Widely used are two different techniques for performing such measurements.

The first technique, known as open loop technique, essentially comprises a magnetic circuit including a gap in which the magnetic field sensor is inserted. The magnetic circuit is excited by current flowing in a winding, thus establishing a magnetic field of induction value B:

$$B = K_C N_M I_M \quad (1)$$

$K_C$ is the core constant, mostly depending on the airgap length and cross-section; $I_M$ is the current to be measured; $N_M$ is the number of turns in the excitation winding.

Although the open loop technique is very simple to implement, it provides no compensation for drifts with temperature and aging of the electrical characteristics of the magnetic field sensor utilized. Its application is therefore limited to low cost, low accuracy, applications.

The second technique, known as closed loop technique, relies on an auxiliary winding, in addition to the main excitation winding, in which a negative feedback circuit controls the current in such a manner as to obtain a zero airgap B field value. The main advantage of tracking a B=0 condition consists in a greatly reduced sensitivity to drifts in the gain of the magnetic field sensor, thus significantly improving overall accuracy.

The negative feedback circuit must be designed in such a manner as to have a passband which goes from zero frequency (corresponding to D.C.) up to the desired frequency (for A.C.). Although an apparatus for implementing the closed loop technique behaves in a manner which is very close to ideal, practical realization of the above-mentioned negative feedback circuit is relatively complex because of the wide bandwidth that typically needs to be provided. Further, if high current values are involved, it is necessary for the auxiliary compensation winding to include a large number of turns in order to reduce the required compensation current, i.e. to reduce the power required for compensation purposes.

For the measurement of magnetic fields, widely used are Hall effect probes and Magnetoresistive probes. Hall effect probes generate an output voltage, $V_H$ (Volts), proportional to the value of the biasing current, $I_B$ (Amperes), and to the magnetic field, B (Tesla), through the factor of proportionality, $K_H$ (sensitivity, with units V/AT):

$$V_H = K_H I_B B \quad (2)$$

The method and apparatuses described in the following description make use of Hall probes for the measurement of B field values. However, the use of magnetoresitive type of sensors is also possible. Most commercially available magnetoresitive sensors are of the Wheatstone bridge type, generating an output voltage, $V_M$ (mV), proportional to the value of the biasing voltage, $V_B$ (Volts), and of the magnetic field, B (Tesla), through the factor of proportionality, $K_M$ (sensitivity, with units (mV/V)/(kA/m)):

$$V_M = K_M V_B B \quad (3)$$

It shall be remarked that at the present state of the art most commercially available magnetoresitive bridge sensors are optimised for the measurement of relatively low B field values (few tens of mT), whereas Hall effect probes are better at the measurement of higher B field values (few hundreds mT). As the magnetic circuit configurations herewith described can easily achieve airgap B field values of few hundreds mT, and hence decreasing the relative importance of inaccuracies introduced by external stray fields, preference will be given to the use of Hall effect probes. In case it might turn out that for some applications also magnetorestive sensors becomes interesting, or that suitable magnetoresistive sensors might become commercially available, those skilled in the art can then easily imagine obvious ways to replace said Hall probes with said magnetoresistive sensors.

In the following, magnetic field sensors generating an output signal of the type described by equation 2 will be referred to as of the type "ratiometric with respect to the supply current", while those generating an output signal of the type described by equation 3 will be referred to as "ratiometric with respect to the supply voltage". It is worth reminding that although the basic Hall effect probe is of the type ratiometric with respect to the supply current, several integrated circuits are commercially available which include an on-chip Hall effect probe cell with added signal conditioning and processing electronics, effectively resulting in an magnetic field sensor of the type ratiometric with respect to the supply voltage.

DESCRIPTION

The object of the present invention is to provide a magnetically coupled electrical current measuring method arranged in order to obtain a self-compensating effect for drifts with temperature and aging of key electrical characteristics of the magnetic field sensors utilized.

Figure 1:
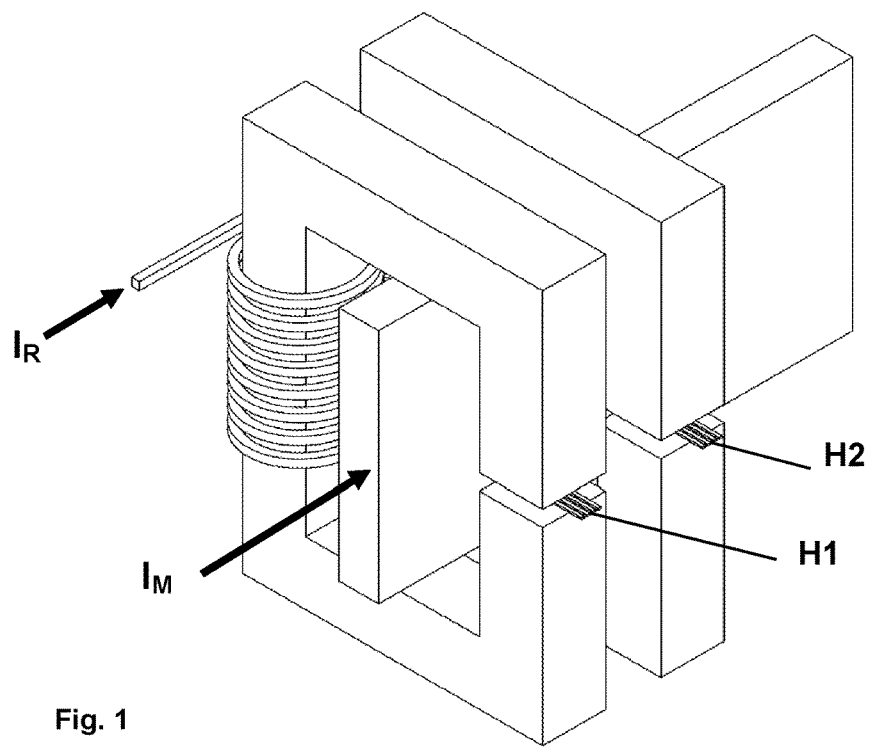
FIG. 1 depicts two gapped cores encircling a bar carrying the current to be measured, $I_M$, both excited by the same reference current, $I_R$, flowing through two series connected auxiliary windings. The magnetic field in the two airgaps is measured by the two Hall probes H1 and H2.
Figure 2:
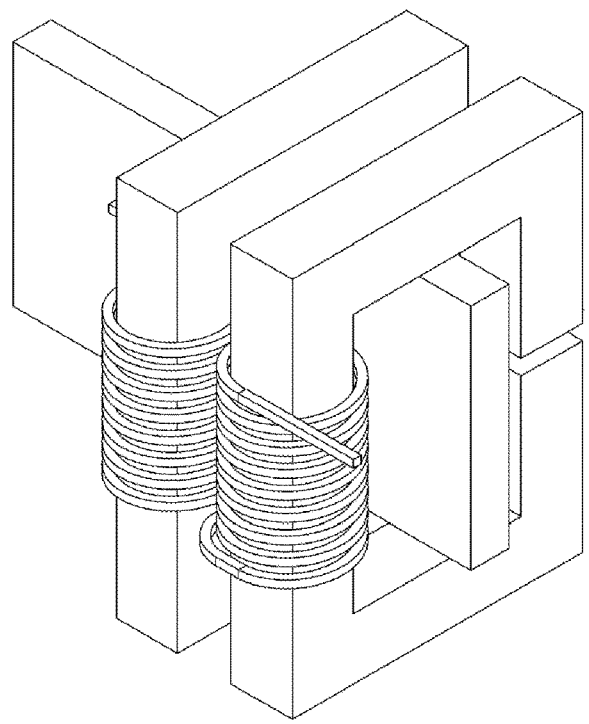
FIG. 2 depicts the two gapped cores of the configuration of FIG. 1 as seen from the opposite side.
Figure 3:
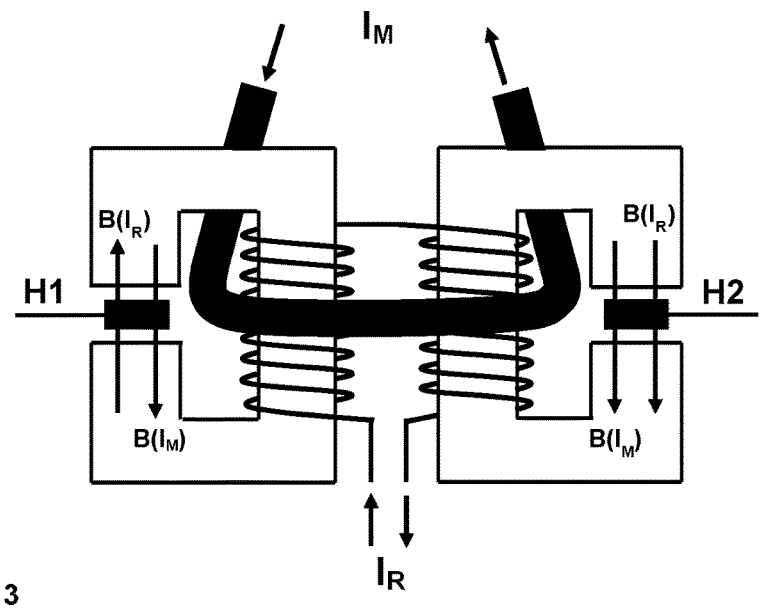
FIG. 3 illustrates the equivalent electrical representation of the two gapped cores configuration of FIG. 1 and FIG. 2.

FIG. 1 (a perspective view from the opposite side is shown in FIG. 2) and FIG. 3 depict a possible current sensor apparatus implementing the proposed self-compensating measurement method. Two magnetic field sensors, H1 and H2, are located in the airgaps of two identical magnetic circuits made of soft magnetic material (such as for example ferrite, silicon steel laminated stack, amorphous materials, etc.). These sort of magnetic circuits are known to the skilled in the art by the descriptive name of "gapped magnetic cores". In the example of FIG. 1 the current to be measured, $I_M$, is carried by the rectangular conductor (e.g. a bus bar) passing through both said gapped magnetic cores. Being the two cores identical, the value of the corresponding B fields established in the two airgaps, $B(I_M)$, will also be identical. Each core additionally carries an auxiliary winding. Said two identical windings are then electrically connected in series, in such a way that an accurate reference current, $I_R$, flowing through both of them will result in an additional component of the B field, $B(I_R)$, summing to $B(I_M)$ in one of said airgaps, while subtracting from it in the other airgap, as exemplified in the electrically equivalent schematic diagram of FIG. 3. The basic principle of operation of the proposed self-compensating measurement method is then illustrated in FIG. 4.

H1 and H2 are two serially connected Hall effect probes, of respective magnetic sensitivities $K_{H1}$ and $K_{H2}$. For the sake of simplicity, we will now refer to $I_M$ and $I_R$ as to actually represent the respective $N_M I_M$ and $N_R I_R$ products ($N_M$=number of turns of the main excitation winding, and $N_R$=number of turns of one auxiliary winding). A1 and A2 represent signal conditioning electronics serving the purpose of pre-amplifying, with respective gains G1 and G2, the differential output voltage generated by H1 and H2, while providing compensation of the Hall probes respective zero field offset voltage values. Effective offset voltage compensation techniques are well known to the skilled in the art, including: dynamic offset cancellation, bias current spinning, and a technique whereby two Hall effect probes with matched offsets are mated back to back and electrically connected in such a way that when summing their output signals the respective offsets subtracts from each other.

Thus, the signals at the output of A1 and A2 become:

$$V1=G1K_C K_{H1} I_B (I_M+I_R)=K(I_M+I_R) \quad (4)$$

$$V2=G2K_C K_{H2} I_B (I_M-I_R)=K(I_M-I_R) \quad (5)$$

whereby the identity G1 $K_C$ $K_{H1}$ $I_B$=G2 $K_C$ $K_{H2}$ $I_B$≡K can be obtained after adjusting the individual gains G1 and G2 for possibly different magnetic sensitivity $K_H$ values, in order that G1 $K_{H1}$=G2 $K_{H2}$ ($K_C$ and $I_B$ then have the same values in both expressions because of the identical cores and of the series connection). It is straightforward to verify that the voltage at the midpoint of the resistive divider (representing a very simple way to implement an accurate adder) is proportional to the current to be measured:

$$K(I_M+I_R+I_M-I_R)/2=KI_M \quad (6)$$

while the voltage at the output of the subtractor is proportional to the reference current:

$$K(I_M+I_R-I_M+I_R)=2KI_R \quad (7)$$

Figure 4:
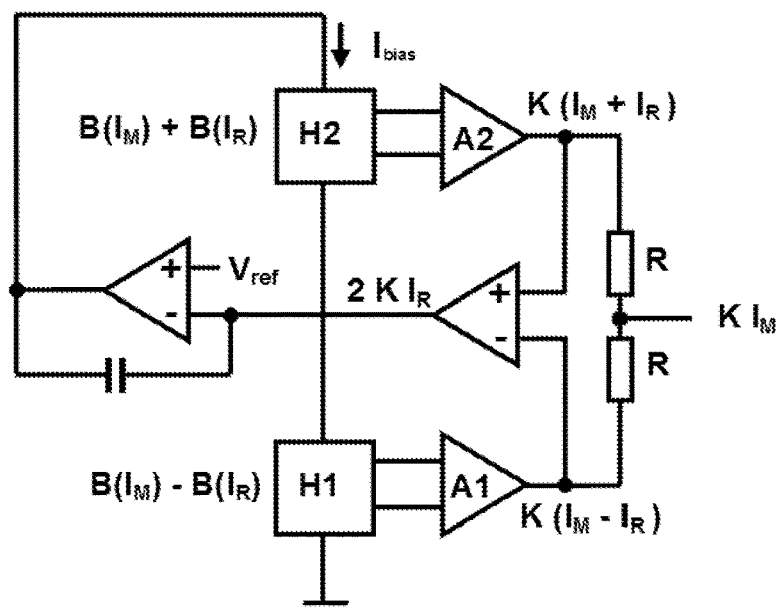
FIG. 4 presents the basic principle of operation of the feedback loop implementing the proposed self-compensating principle of operation.
Figure 5:
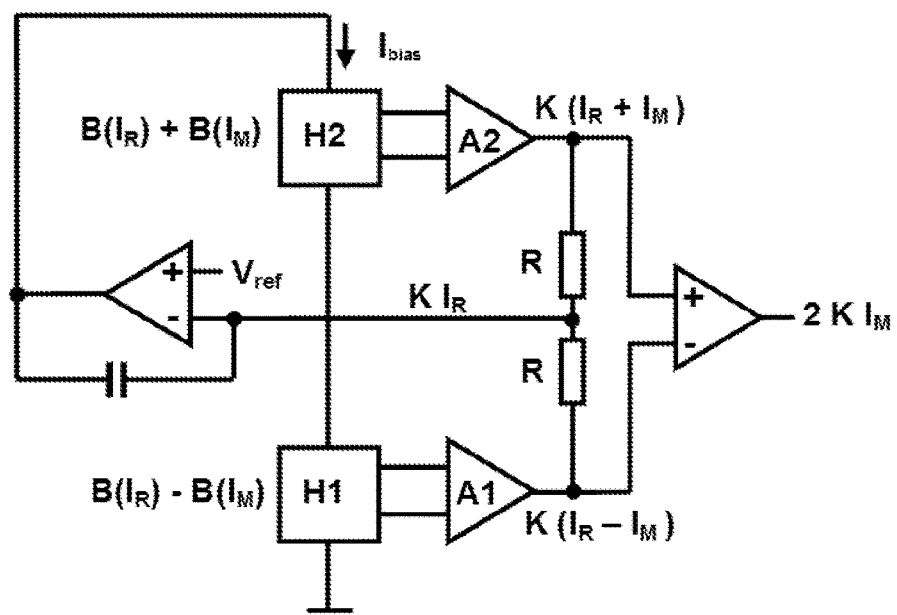
FIG. 5 presents the symmetric implementation of the feedback loop of FIG. 4.

FIG. 5 depicts the equivalent self-compensating feedback loop configuration in case one of the Hall effect sensor is mounted the other way around with respect to the direction of $B(I_M)$, so that the signal proportional to $I_R$ is now available at the output of the adder instead than at the output of the subtractor. In other words, depending on the relative mounting orientation of the magnetic field sensors, the voltage proportional to $I_R$ will be available at the output of the adder or at the output of the subtractor. Either ways, the feedback loop is arranged in order to maintain at a constant reference voltage $V_{ref}$ the signal proportional to $I_R$ (i.e. the signal named K $I_R$ in FIG. 4 and FIG. 5). The operational amplifier integrator configuration visible in FIG. 4 and FIG. 5 schematically represents, in a simplified way, a conventional Proportional-Integral-Derivative (PID) circuital block. For most applications it will simply be sufficient to implement the Proportional-Integral block only. However, depending on the specific dynamical response requirements, the skilled in the art can then decide whether or not to implement also the Derivative block. For magnetic field sensors of the type ratiometric with respect to the supply current, such as Hall effect probes, the following example will aid in understanding the details of the principle of operation:

the two Hall probes are selected in order to be matched in their respective drifts with temperature of the magnetic sensitivity, i.e. in order to feature very similar values of the temperature coefficient of the magnetic sensitivity;

the reference current, $I_R$, flowing through the auxiliary winding is generated by means of any of the circuital solutions known to the skilled in the art for being able to provide a very accurate and constant current value;

would the magnetic sensitivity of both Hall probes drift with temperature by for example +10%, then the feedback loop will automatically react decreasing by 10% the value of $I_B$, so as to hold at a constant value the product K $I_R$, and thus K (because $I_R$ is already held at a constant value by independent means);

in this way the output signal proportional to $I_M$ has now become largely independent from drifts with temperature of the magnetic sensitivity of the two Hall probes.

It will be apparent to those skilled in the art how to modify FIG. 4 and FIG. 5 in order to suit magnetic field sensors belonging to the type ratiometric with respect to the supply voltage, namely, by connecting said sensors supply inputs in parallel instead than in series.

Typically, sensors from the same manufacturing wafer lot would feature very similar behavior in terms of magnetic field sensitivity drift with temperature and aging, thus providing a sufficient degree of matching for an accurate current sensor.

A preferred embodiment of apparatus implementing the self-compensating method just described is illustrated in FIG. 1, FIG. 2, and FIG. 3. The fact that the two auxiliary winding carrying the reference current $I_R$ are serially connected in such a way that $B(I_R)$ adds to $B(I_M)$ in one of the cores, while subtracting from it in the other core, conveniently implies that only purely D.C. performances are required from the current source generating it, as any higher frequency component (of the current to be measured $I_M$) would induce, in said two auxiliary windings, voltages of equal amplitude but opposite signs, and thus cancelling out.

Figure 6:
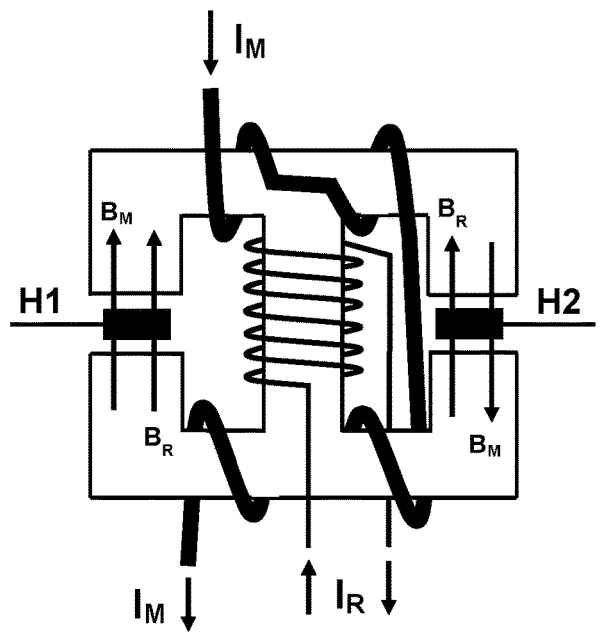
FIG. 6 illustrates a magnetic circuit configuration whereby only one auxiliary coil is sufficient.

FIG. 6 illustrates a second preferred embodiment of apparatus in accordance with the invention, whereby the magnetic circuit is so arranged that the two airgaps appear in series with respect to the magnetic flux generated by the winding carrying $I_M$, while appearing in parallel with respect to the flux generated by the auxiliary winding carrying $I_R$. Furthermore, the turns of the main excitation winding carrying $I_M$ are distributed along the magnetic circuit in order that the net generated flux closing through the parallel magnetic circuit branch carrying the auxiliary winding is zero (it is easy to verify that, through the central column, the turns at the right generate a magnetic flux which exactly subtracts from the flux generated by the turns at the left). Thus, also this embodiment is characterized in that it requires only purely D.C. performances from the current source generating $I_R$, greatly simplifying its design. The reference $B(I_R) \equiv B_R$ field then adds to $B(I_M) \equiv B_M$ in one of the two airgaps, while subtracting from it in the other. Granted that the reference $B_R$ field needs to be a D.C. field only, it is just natural to try to replace said auxiliary winding with a permanent magnet. In fact, there exist special formulations of Samarium Cobalt (SmCo) permanent magnet materials featuring excellent temperature stability performances, with Grade 2:17TC-16 achieving −0.001%/° C.

Figure 7:
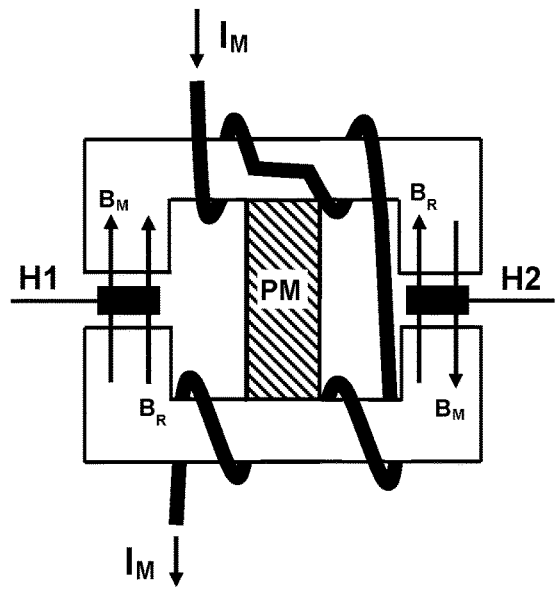
FIG. 7 presents a magnetic circuit configuration whereby the central column and auxiliary coil visible in FIG. 6 have been replaced by a permanent magnet.

Thus, in a third preferred embodiment of apparatus in accordance with the invention, schematically represented in FIG. 7, the central column and auxiliary winding of FIG. 6 has been replaced by the permanent magnet PM. In one of the two airgaps said permanent magnet establishes a reference $B_R$ field adding to $B_M$, while subtracting from it in the other airgap, and thus allowing the application of the self-compensating feedback loop method described heretofore.

Figure 8:
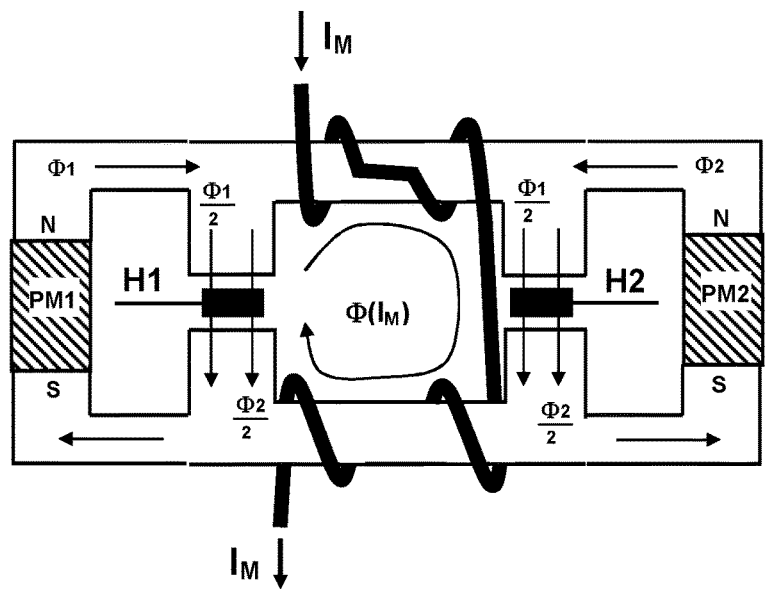
FIG. 8 depicts a configuration whereby the reference field in the two airgaps is obtained by means of two permanent magnets instead of one.

In another advantageous embodiment of apparatus in accordance with the invention, the reference $B_R$ field at the two airgaps is established by the magnetic fluxes, $\Phi_1$ and $\Phi_2$, generated by a pair of permanent magnets arranged with their respective North and South poles oriented as illustrated in FIG. 8. In this way about half of $\Phi_1$ will add to about half $\Phi_2$ in both airgaps. Thus, the resulting reference $B_R$ field will add to $B_M$ in one of the airgaps, while subtracting from it in the other, in turn allowing the application of the self-compensating feedback loop described heretofore. It shall be remarked that a certain fraction of the flux $\Phi_M$ established by the winding carrying the current to be measured $I_M$, will also interest both PM1 and PM2, slightly shifting their respective working points. However, because the result would be to slightly increase $\Phi_1$ (or $\Phi_2$), but while symmetrically decreasing the $\Phi_2$ (or $\Phi_1$), the negative impact on the constancy of $B_R$ (i.e. its independence from $I_M$) is significantly reduced (as in each airgap $\Phi_R = \Phi_1/2 + \Phi_2/2$).

Figure 9:
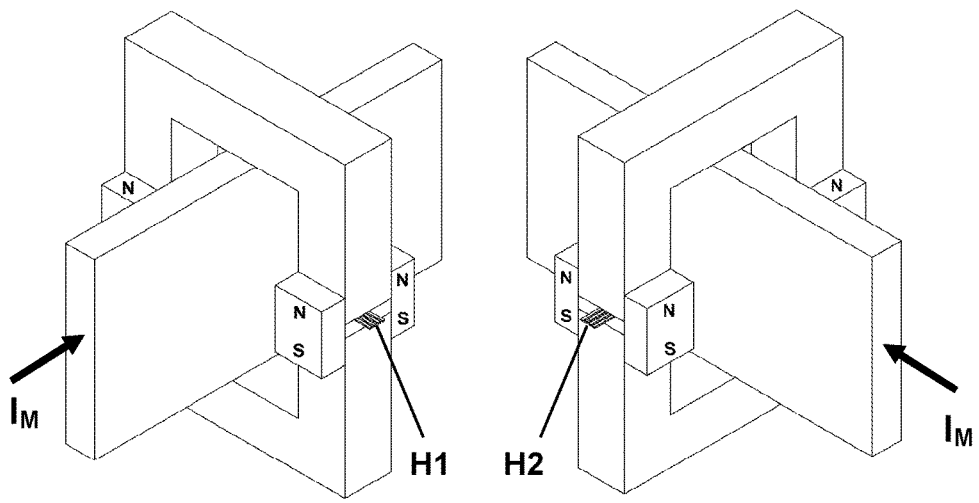
FIG. 9 presents the front and back perspective views of an advantageous variant embodiment of the configuration of figure FIG. 8.

FIG. 9 illustrates the front and back perspective views of an advantageous variant embodiment of the configuration of FIG. 8, whereby a plurality of pairs of permanent magnets are conveniently located as to directly surround the two airgaps.

Figure 10:
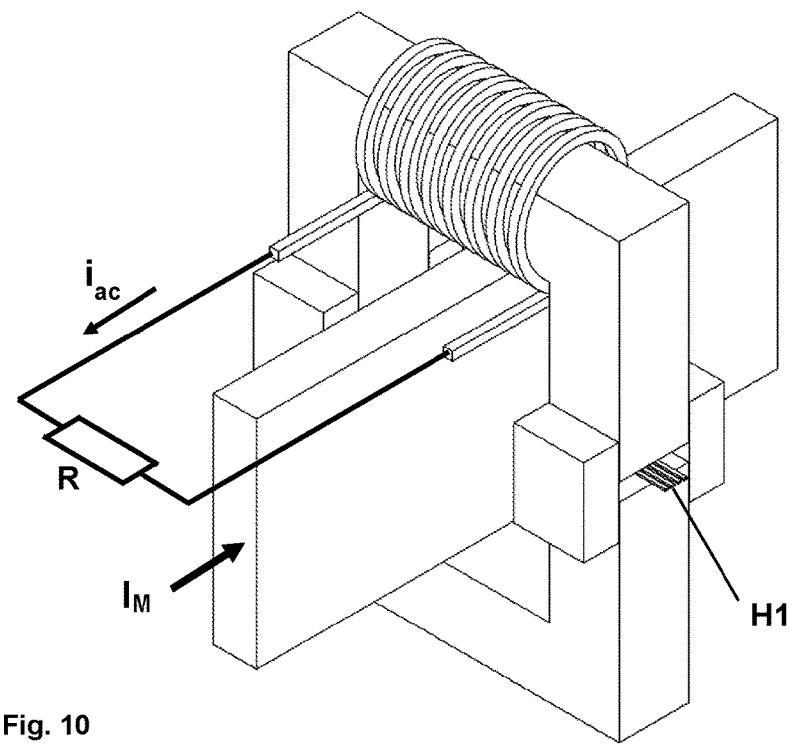
FIG. 10 illustrates how, by adding an additional coil in a classical current transformer configuration, higher frequency components can also be measured.

Similarly to the technique disclosed in U.S. Pat. No. 4,961,049, for electrical current measurements requiring large bandwidth a further winding can be added, as illustrated in FIG. 10, mutually coupling with the winding carrying the current to be measured $I_M$ according to a conventional current transformer configuration. The voltage across the shunt resistor R, proportional to the higher frequency components of $I_M$, can then be added to the voltage proportional to the lower frequency components produced by the self-compensating feedback loop of the method described heretofore.

As can be seen from the above, the invention is not limited to the embodiments and the applications which have been described in detail. On the contrary, the invention extends to any variant which may occur to the person skilled in the art without going beyond its scope.

The invention claimed is:

1. A method of measuring the value of an electric current ($I_M$) by computing a function of the output signals of two magnetic field sensors (H1, H2) each inserted in a respective one of two airgaps of a magnetic circuit, both sensors belonging to the type ratiometric with respect to the supply current or both belonging to the type ratiometric with respect to the supply voltage and featuring matched temperature coefficients of the respective magnetic field sensitivity; wherein a magnetic flux is established in said magnetic circuit by a first winding being configured to carry the current being measured ($I_M$), and thus resulting, at both magnetic field sensors locations, in a first magnetic field component ($B_M$, $B(I_M)$) proportional to said current being measured; said method further comprising the step of establishing at said two magnetic field sensors locations a second magnetic field component ($B_R$, $B(I_R)$) possessing a constant reference magnetic field value, independent from the value of the current being measured, adding to said first magnetic field component at one of said two magnetic field sensors locations, while subtracting from it at the other location; wherein said second magnetic field component is established by means of at least one permanent magnet or by means of at least one second winding configured to carry a current of a constant reference value; said method further comprising the step of processing through and adder circuit and a subtractor circuit the output signals generated by said two magnetic field sensors, so as to produce an output sum signal and an output difference signal, and thus resulting in one of said output sum and difference signals being proportional to said second magnetic field component solely and the other one of said output sum and difference signals being proportional solely to the first magnetic field component established by the current being measured; whereby the output signal proportional to said second magnetic field component is then used in a feedback loop configured to control the supply current feeding the two series supplied magnetic field sensors, in case the magnetic field sensors belong to the type ratiometric with respect to the supply current, or the supply voltage of the two parallel supplied magnetic field sensors, in case the magnetic field sensors belong to the type ratiometric with respect to the supply voltage, in order to hold at a constant reference voltage value said output signal proportional to said second magnetic field component, consequently resulting in an automatic compensation of the impact of temperature drifts of the magnetic sensitivities on the accuracy of the output signal proportional to said first magnetic field component established by the current to be measured.

2. An apparatus configured to implement the method as claimed in claim 1, wherein the current being measured ($I_M$) couples to the magnetic circuit composed of two identical gapped magnetic cores, the first winding being configured to carry the current being measured ($I_M$) and having the function to establish at both of said magnetic field sensors locations identical values of said first magnetic field component ($B(I_M)$) proportional to said current $I_M$, and further comprising the at least one second winding in the form of two identical auxiliary windings, each auxiliary winding coupling to just one of said gapped magnetic cores, serially connected in order to carry the same current of a constant reference value and whose function is to establish at both of said magnetic field sensors locations the second magnetic field component ($B(I_R)$), wherein said current of a constant reference value flows through one of said auxiliary windings in the direction resulting in said second magnetic field component adding to the first magnetic field component at one of said magnetic field sensors locations, while flowing in the opposite direction through the other winding and thus resulting in the second magnetic field component subtracting from the first magnetic field component at the other magnetic field sensor location.

3. An apparatus configured to implement the method as claimed in claim 1, comprising the magnetic circuit so arranged that the two airgaps are in series with respect to the magnetic flux generated by the first winding carrying the current being measured ($I_M$) and featuring the second winding wound around a parallel branch of said magnetic circuit, and wherein said parallel branch is positioned in such a way that said two airgaps are in parallel with respect to the magnetic flux generated by said second winding, while the net magnetic flux fraction generated by the first winding and which closes through said parallel branch is null; wherein said second winding is configured to carry a current of a constant reference value having the function to establish at both of said magnetic field sensors locations the second magnetic field component ($B_R$) which adds to the first magnetic field component ($B_M$) at one of the magnetic field sensor locations, while subtracting from it at the other magnetic field sensor location.

4. An apparatus configured to implement the method as claimed in claim 1, comprising the magnetic circuit so arranged that the two airgaps are in series with respect to the magnetic flux generated by the first winding carrying the current being measured ($I_M$), wherein said magnetic circuit features at least one parallel magnetic circuit branch excited by the at least one permanent magnet and positioned in so that the two airgaps are in parallel with respect to the magnetic flux generated by said permanent magnet(s), whereby one of the airgaps is configured to receive one half of said flux while the other airgap is configured to receive the other half; wherein said magnetic flux generated by said permanent magnet(s) has the function to establish at both of said magnetic field sensors locations the second magnetic field component ($B_R$) which adds to the first magnetic field component ($B_M$) at one of the magnetic field sensors locations, while subtracting from it at the other magnetic field sensor location.

* * * * *